US006668000B2

(12) United States Patent
Choa

(10) Patent No.: US 6,668,000 B2
(45) Date of Patent: Dec. 23, 2003

(54) SYSTEM AND METHOD OF OPTICALLY TESTING MULTIPLE EDGE-EMITTING SEMICONDUCTOR LASERS RESIDING ON A COMMON WAFER

(75) Inventor: Fow-Sen Choa, Baltimore, MD (US)

(73) Assignee: University of Maryland, Baltimore County, Baltimore, MD (US)

( * ) Notice: Subject to any disclaimer, the term of this patent is extended or adjusted under 35 U.S.C. 154(b) by 0 days.

(21) Appl. No.: 10/023,998

(22) Filed: Dec. 21, 2001

(65) Prior Publication Data

US 2002/0051474 A1 May 2, 2002

Related U.S. Application Data

(63) Continuation-in-part of application No. 09/353,792, filed on Jul. 15, 1999, now Pat. No. 6,337,871.

(51) Int. Cl.⁷ .............................. H01S 5/00; H01S 3/08
(52) U.S. Cl. .............................. 372/43; 372/45; 372/46; 372/96
(58) Field of Search .................... 372/45–46, 96–97, 372/102, 43

(56) References Cited

U.S. PATENT DOCUMENTS

| | | | |
|---|---|---|---|
| 4,737,962 A | * | 4/1988 | Yamamoto et al. ........... 372/49 |
| 4,894,835 A | | 1/1990 | Uomi et al. |
| 4,956,844 A | * | 9/1990 | Goodhue et al. ............. 372/44 |
| 5,479,426 A | * | 12/1995 | Nakanishi et al. ............ 372/43 |
| 5,828,688 A | * | 10/1998 | Cook et al. .................... 372/96 |
| 5,900,619 A | * | 5/1999 | Honda et al. ............. 250/201.5 |
| 5,953,361 A | | 9/1999 | Borchert et al. |
| 6,052,399 A | | 4/2000 | Sun |
| 6,057,918 A | * | 5/2000 | Greary et al. ................ 356/218 |
| 6,104,739 A | | 8/2000 | Hong et al. |
| 6,108,355 A | | 8/2000 | Zorabedian |
| 6,121,634 A | | 9/2000 | Saito et al. |
| 6,265,237 B1 | | 7/2001 | Heffner et al. |
| 6,337,871 B1 | * | 1/2002 | Choa ........................... 372/45 |

OTHER PUBLICATIONS

Chih–Ping Chao et al.; "1.3–μm Wavelength, InGaAsP–InP Folded–Cavity Surface–Emitting Lasers Grown by Gas–Source Molecular–Beam Epitaxy"; IEEE Photonics Technology Letters, vol. 6. No. 12, Dec. 1994; pp. 1406–1408.

Jin–Shown Shie et al.; "A micromachined silicon–submount package for vertical emission of edge emmiting laser diodes"; Sensors and Actuators 82 (2000); pp. 297–301.

* cited by examiner

Primary Examiner—Paul Ip
Assistant Examiner—James Menefee
(74) Attorney, Agent, or Firm—Fleshner & Kim, LLP

(57) ABSTRACT

A system and method of testing multiple edge-emitting lasers on a common wafer is provided. This is accomplished by providing, for each edge-emitting laser on a common fabrication wafer, a structure that re-directs a portion of the edge-emitted light from each edge-emitting laser in a direction such that the re-directed portion from each edge-emitting laser can be measured while the edge-emitting lasers are still on the fabrication wafer. Each edge-emitting laser on the fabrication wafer can therefore be easily tested before cleaving or breaking the wafer into multiple pieces.

12 Claims, 5 Drawing Sheets

SYSTEM AND METHOD OF OPTICALLY TESTING MULTIPLE EDGE-EMITTING SEMICONDUCTOR LASERS RESIDING ON A COMMON WAFER

This application is a continuation-in-part of U.S. patent application Ser. No. 09/353,792 filed Jul. 15, 1999, entitled "Multiple Edge-Emitting Laser Components Located on a Single Wafer and the On-Wafer Testing of the Same", now U.S. Pat. No. 6,337,871, which is hereby incorporated by reference.

BACKGROUND OF THE INVENTION

1. Field of the Invention

This invention relates to edge-emitting semiconductor lasers that are manufactured on a single fabrication wafer and, more specifically, to an edge-emitting semiconductor laser that is capable of being optically tested while it is still located on the fabrication wafer (prior to cleaving or sawing).

2. Background of the Related Art

Edge-emitting lasers are semiconductor lasers with horizontal laser cavities (resonant cavities that are parallel to the plane of the wafer on which they are fabricated) that emit outputs in a horizontal direction through the edges of the laser. When manufacturing edge-emitting lasers, multiple laser cavities are usually formed in parallel strips on the surface of a single fabrication wafer. Each strip is divided into multiple segments to form multiple coaxial lasers on the wafer. The fabrication wafer is then cleaved or sawed to separate the individual lasers.

As many as 25,000 or more individual lasers can generally be fabricated on a single fabrication wafer. Each individual laser is typically tested for quality control purposes. This generally involves measuring the laser emission as a function of applied current. "On-wafer" testing, in which each laser is tested while they are still on the fabrication wafer, is the most efficient and cost effective way of testing the lasers.

However, because edge-emitting lasers emit light from their respective edges, the light emitted from most of the lasers (except the lasers at the very edge of the fabrication wafer) get blocked by other adjacent lasers, and thus is not detectable. Thus, edge-emitting lasers must be tested after they have been separated by cleaving or sawing the fabrication wafer. This is very time consuming, and thus increases manufacturing costs significantly.

Vertical cavity surface-emitting lasers were developed, in part, because on-wafer testing is so desirable in terms of efficiency and cost reduction. Vertical cavity surface-emitting lasers have resonant cavities that are perpendicular to the plane of the fabrication wafer, and thus emit light vertically with respect to the fabrication wafer. The vertically-emitted light from each laser can be measured prior to cleaving or sawing of the fabrication wafer, because the light is not blocked by adjacent lasers.

However, vertical resonant cavities are difficult to fabricate and require complicated device processing techniques. Further, vertical cavity surface-emitting lasers have lower output powers and quantum efficiencies than edge-emitting lasers.

The above references are incorporated by reference herein where appropriate for appropriate teachings of additional or alternative details, features and/or technical background.

SUMMARY OF THE INVENTION

An object of the invention is to solve at least the above problems and/or disadvantages discussed above and to provide at least the advantages described hereinafter.

The present invention provides a system and method of testing multiple edge-emitting lasers on a common fabrication wafer. This is accomplished by providing, for each edge-emitting laser on a common fabrication wafer, a structure that re-directs a portion of the edge-emitted light from each edge-emitting laser in a direction such that the re-directed portion from each edge-emitting laser can be measured while the edge-emitting lasers are still on the fabrication wafer. Each edge-emitting laser on the wafer can therefore be easily tested without cleaving or breaking the wafer into multiple pieces.

The present invention may be practiced in whole or in part by an edge-emitting laser, comprising a resonant cavity and a second order or higher grating formed in the resonator, wherein the second order or higher grating transmits a first portion of light in the resonator along a first direction as edge-emitted light, and directs a second portion of light in the resonator along a different direction.

The present invention may also be practiced in whole or in part by a horizontal cavity edge emitting laser comprising a resonant cavity and a trench positioned proximate to the resonant cavity that is configured to scatter a portion of light in the resonant cavity such that the scattered portion can be measured.

The present invention may also be practiced in whole or in part by a method of testing at least two horizontal cavity edge-emitting lasers on a common wafer, comprising re-directing a portion of the light generated by each edge-emitting laser such that the re-directed portion can be detected while the edge-emitting lasers reside on the common wafer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

The invention is described below with reference to the accompanying figures wherein.

DETAILED DESCRIPTION OF PREFERRED EMBODIMENTS

Figure 1:
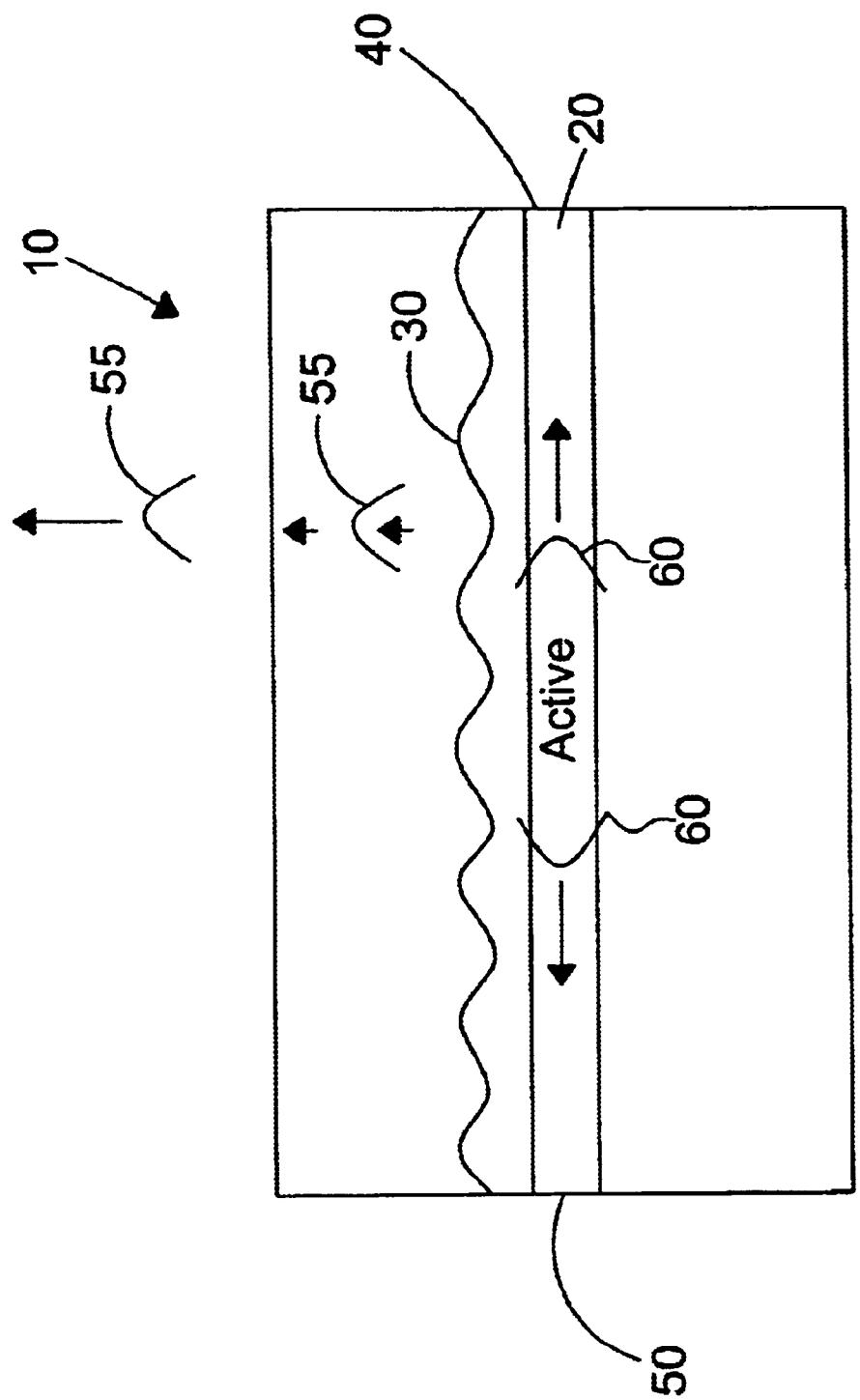
FIG. 1 is a schematic view of a horizontal cavity edge-emitting laser, in accordance with one embodiment of the present invention.

FIG. 1 is a schematic view of a horizontal cavity edge-emitting laser 10 that incorporates a structure that re-directs a portion of the edge-emitted light from the edge-emitting laser 10 in a direction such that the re-directed portion from the edge-emitting laser 10 can be measured while the edge-emitting laser 10 is still on the fabrication wafer, in accordance with one embodiment of the present invention.

The edge-emitting laser 10 includes an active region 20, a grating structure 30 and front and rear facets 40 and 50 The facets 40 and 50 act as reflectors to provide optical feedback. The grating structure 30 is a second order or higher grating that, in addition to providing optical feedback, also redirects a portion 55 of a guided edge-emitted component 60 in a direction that allows the portion 55 to be measured while the edge-emitting laser 10 is still on the fabrication wafer.

Although the grating structure 30 is shown above the active layer 20, it should be appreciated that the grating structure 30 could also be positioned below or to the side of the active layer 20 while still falling within the scope of the present invention. In general, the grating structure 30 can be positioned at any position that will allow it to provide optical feedback and re-direct the portion 55 of the guided edge-emitted component 60 in a direction that will allow the portion 55 to be measured while the edge-emitting laser 10 is still on the fabrication wafer.

Figure 2:
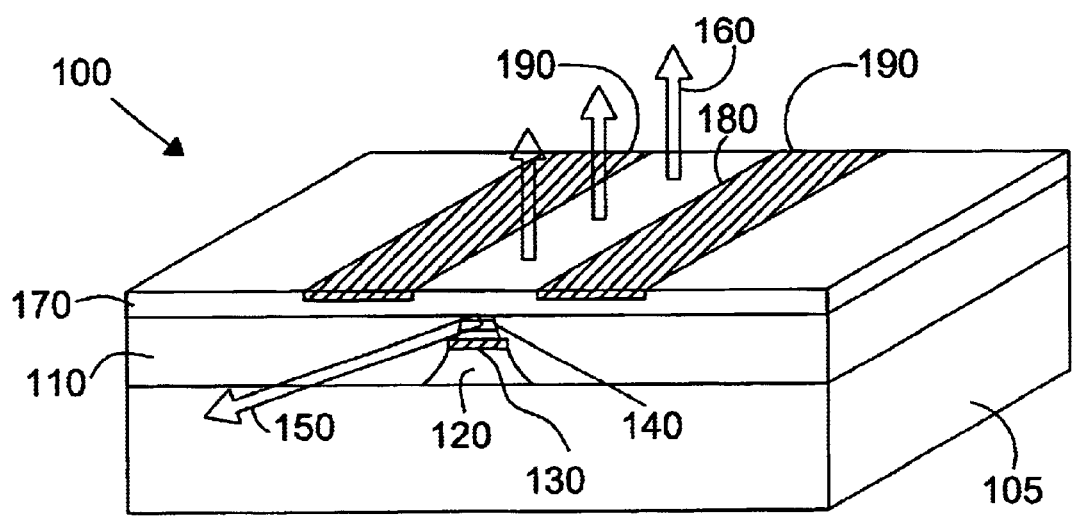
FIG. 2 is a perspective view of a horizontal cavity edge-emitting laser, in accordance with another embodiment of the present invention.

FIG. 2 is a perspective view of a horizontal cavity edge-emitting laser 100 that incorporates a second order or higher grating structure, in accordance with another embodiment of the present invention.

The edge-emitting laser 100 comprises a substrate layer 105. Substrate layer 105 is preferably an N-Substrate although it can also be other types of substrates, such as a P-Substrate. Located above substrate layer 105 is an insulating layer 110. At least one channel 120 is located in insulating layer 110 so that portions of insulating layer 110 are located on either side of channel 120. Insulating layer 110 blocks current from flowing outside of channel 120 and is usually a regrown semi-insulating material such as a Semi Insulating Indium Phosphate (SI InP) preferably iron doped. However any material with a higher bandgap than the channel 120 may be used.

Located inside channel 120 is a grating layer 130 and a waveguide stripe 140 is located above the grating layer 130. Grating layer 130 permits feedback and coupling of outputs in a horizontal, lengthwise axial direction through channel 120, depicted by an arrow 150 which represents an edge-emitted component. Prior art edge-emitting laser with grating layers, also referred to as distributed feedback (DFB) lasers, utilize first order gratings that provide optical feedback. However, the grating layer 130 utilized in laser 100 is a second order or higher grating, in addition to providing optical feedback, also redirects a portion of the edge-emitted component as a surface-emitted component 160, in a direction that allows the surface-emitted component to be measured while the edge-emitting laser 100 is still on the fabrication wafer.

In a preferred embodiment, a second order grating is used for the grating layer 130. Gratings with orders greater than two may be used, but there is a trade-off with laser efficiency due to the increased light scatter as the grating order increases. An aspect of the present invention is the recognition that the use of a second order grating provides sufficient scattering of the light towards the surface of the laser for monitoring purposes, while not significantly reducing the laser's efficiency.

Located above the waveguide stripe 140 and insulating layer 110 is a cap layer 170. Cap layer 170, shown in FIG. 2, is a P-Cap layer formed from a P-type semiconductor material. However, it should be appreciated that cap layer 170 may be formed of other types of semiconductor material, such as an N-type semiconductor material, while still falling within the scope of the present invention.

Located above waveguide stripe 140 in cap layer 170 is an opening 180 allowing surface-emitted component 160 to be emitted. Located on either side of opening 180 are metal stripes 190, that are used to provide power to the laser 100.

The edge-emitting laser 100 of the present invention emits a surface-emitted component 160, in addition to the edge-emitted component 150. The surface-emitting component 160 is used for on-wafer testing to obtain certain laser parameters, such as the current/voltage (I/V) relationship used to determine the terminal voltage, the light/current (L/I) relationship used for determining the power to current characteristics of each laser, and the mode behavior of the laser (also referred to as "wavelength testing"). Thus, expensive and time consuming testing of each individual laser after cleaving, scribing, dicing or sawing is avoided.

On-wafer testing identifies the lasers whose performance characteristics are unacceptable. In some cases, lasers with unacceptable mode behavior may be reprocessed, prior to separation from the fabrication wafer, by changing the coating on the facets and/or changing the effective position of the facets. In principal, yields of close to 100 % can be achieved.

Figure 3:
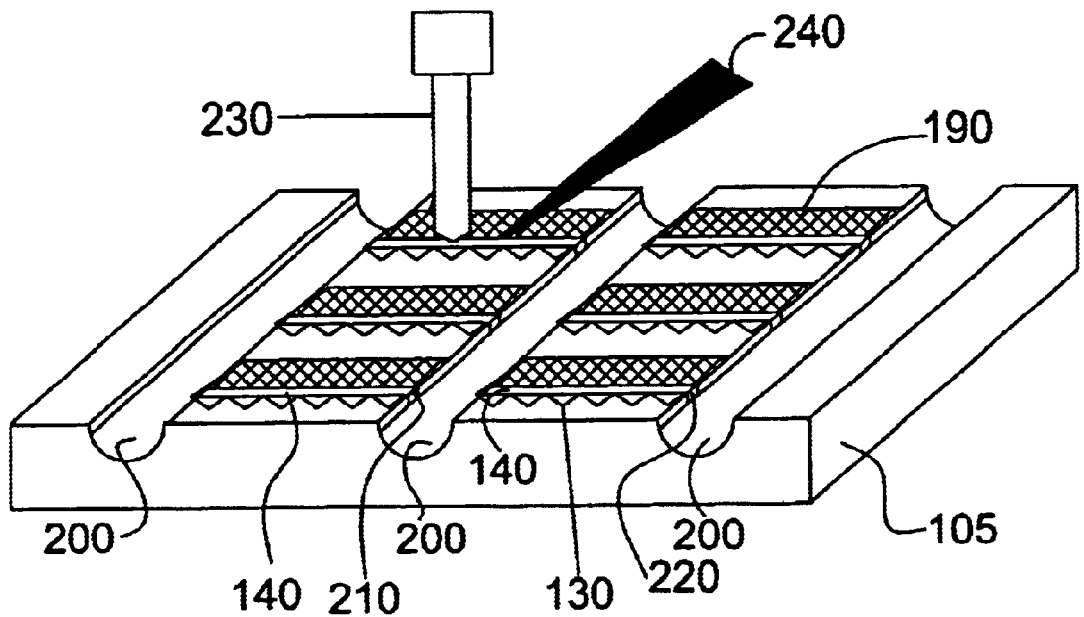
FIG. 3 is a perspective view showing how multiple edge-emitting lasers on a single fabrication wafer can be tested while still on the fabrication wafer, in accordance with the present invention.

FIG. 3 is a perspective view showing how multiple edge-emitting lasers on a single fabrication wafer 105 can be tested while still on the fabrication wafer 105, in accordance with one embodiment of the present invention. The edge-emitting laser 100 of FIG. 1 are fabricated in multiple numbers on a common fabrication wafer 105, using well-known semiconductor laser manufacturing techniques. However, a second order or higher grating 130 is used in place of the first order grating used in prior art DFB lasers.

Multiple coaxial channels 210 and 220 are located on the fabrication wafer 105. Trenches 200 separate each coaxial channel 210 and 220. Electrode 240 is used to provide power to the laser being tested, by contacting the metal stripe 190 of the laser being tested. A lensed fiber 230 is preferably used to receive the surface-emitted output 160 from the laser being tested. However, any means of receiving the surface-emitted output 160, such as a lens or a fiber, may be used.

Figure 4:
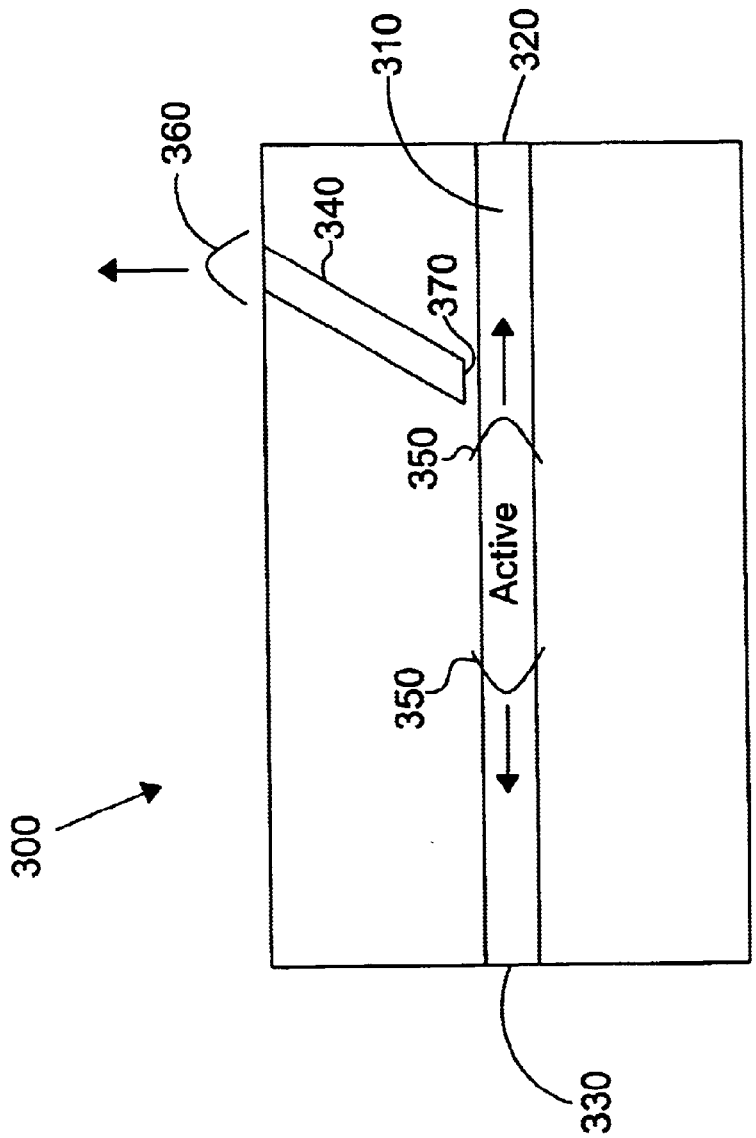
FIG. 4 is a schematic view of a multi-mode edge-emitting laser, in accordance with another embodiment of the present invention.

As discussed above, the edge-emitting laser 100 of FIG. 2 is a DFB laser, which are generally single-mode. However, the present invention can also be applied to multi-mode edge-emitting lasers. FIG. 4 is a schematic cross-sectional view of a multi-mode edge-emitting laser 300 that incorporates a structure that re-directs a portion of the edge-emitted light from the edge-emitting laser 300 in a direction such that the re-directed portion from the edge-emitting laser 300 can be measured while the edge-emitting laser 300 is still on the fabrication wafer, in accordance with another embodiment of the present invention.

The laser 300 includes an active region 310, and front and rear facets 320 and 330. The facets 320 and 330 act as reflectors to provide optical feedback. This type of laser is also know as a Fabry-Perot laser, and receives all of its optical feedback from the facets 320 and 330.

The laser 300 also includes a scattering trench 340, that scatters a portion of the guided edge-emitted component 350 towards the surface of the laser 300. The scattered portion exits the laser as a surface-emitted component 360. The scattering trench is preferably designed so that the surface-emitted component is strong enough to be detected, without significantly affecting the edge-emitted component 350. In a preferred embodiment, the scattering trench is 3–5 μm wide, and makes an angle of approximately 45 degrees with respect to the plane of the active region 310. The bottom 370 of the scattering trench 340 is preferably positioned 100–200 nm from the active region.

Figure 5:
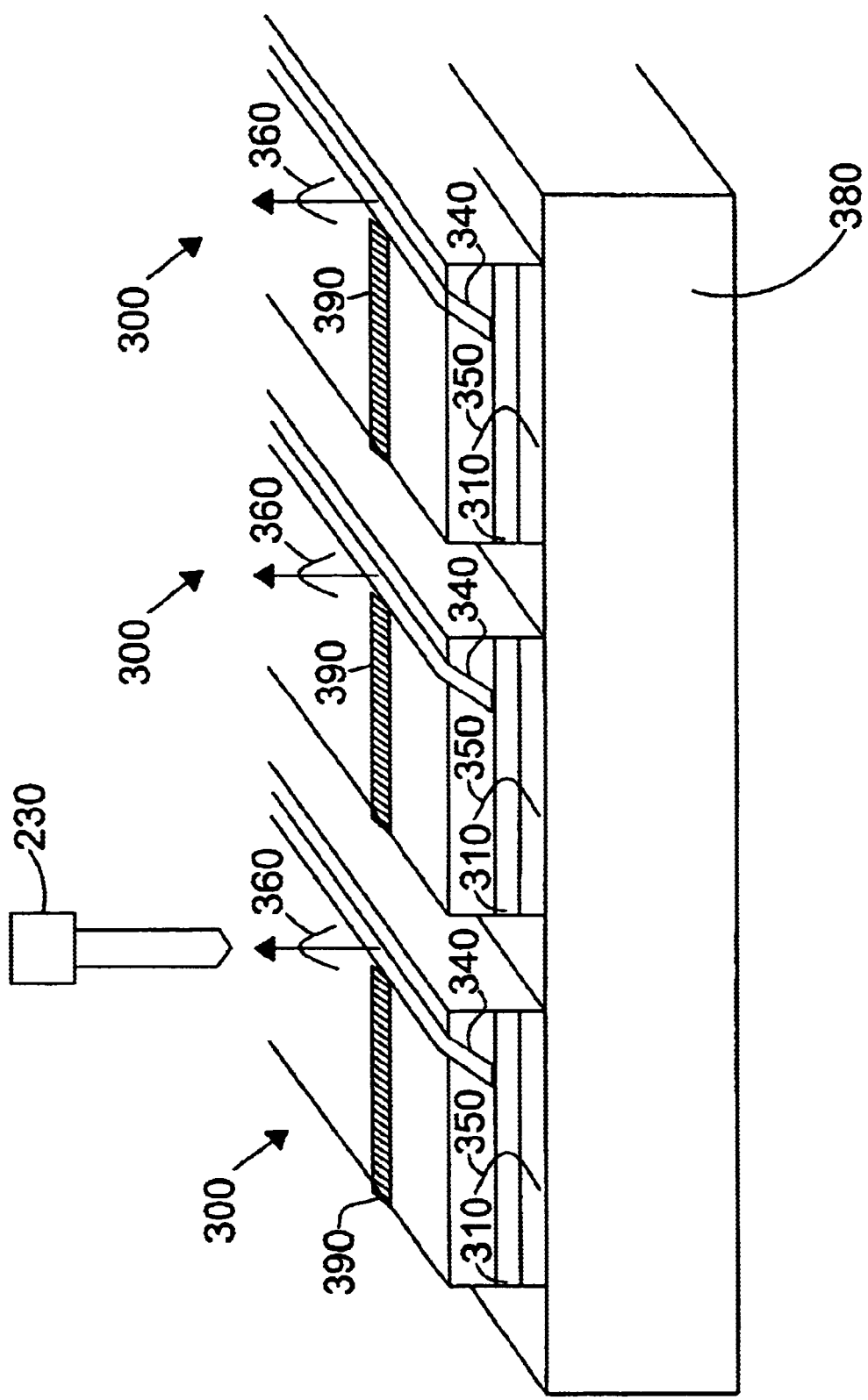
FIG. 5 is a schematic perspective view showing how multiple multi-mode edge-emitting lasers on a common fabrication wafer can be tested while still on the fabrication wafer, in accordance with the present invention.

FIG. 5 is a schematic perspective view of multiple multi-mode edge-emitting lasers 300 on a common fabrication wafer 380, in accordance with the present invention. The lasers 300 are fabricated in multiple numbers on a common fabrication wafer 380 using semiconductor laser fabrication techniques well-known in the art. However, as part of the fabrication process, trenches 340 are formed, preferably using vertical etching techniques such as reactive ion etching (RIE) or chemical assisted ion beam etching (CAIBE).

After fabrication, each individual laser can be tested by applying a drive current to their respective electrodes 390, and measuring the surface-emitted component 360, preferably with a lensed fiber 230.

The invention being thus described, it will be obvious that the same may be varied in many ways. Such variations are not to be regarded as a departure from the spirit and scope of the invention and all such modifications are intended to be included within the scope of the following claims.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A semiconductor laser formed on a fabrication wafer, comprising:
    a resonant cavity that is substantially parallel to a plane of the fabrication wafer, and that is configured to emit light in a direction substantially parallel to the plane of the fabrication wafer as edge-emitted light; and
    a non-diffractive light scatterer positioned proximate to an active region of the resonant cavity that scatters a portion of the emitted light in a different direction than the edge-emitted light, said portion being less than the entire edge-emitted light.

2. The semiconductor laser of claim 1, wherein the non-diffractive light scatterer scatters the portion of the emitted light in a direction such that the scattered portion can be measured before the semiconductor laser is separated from the fabrication wafer.

3. The semiconductor laser of claim 2, wherein the non-diffractive light scatterer scatters the portion of the edge-emitted light in a direction substantially perpendicular to the plane of the fabrication wafer.

4. The semiconductor laser of claim 1, wherein the non-diffractive light scatterer comprises a trench.

5. A multi-mode semiconductor laser formed on a fabrication wafer, comprising:
    an active region;
    first and second reflectors positioned on opposite ends of the active region, wherein the first and second reflectors and the active region collectively form a resonant cavity that lies in a plane that is substantially parallel to a plane of the fabrication wafer, and that emits light in a direction substantially parallel to the plane of the fabrication wafer as edge-emitted light; and
    a trench positioned proximate to the active region, that non-diffractively scatters a portion of the edge-emitted light in a different direction than the edge-emitted light, said portion being less than the entire edge-emitted light.

6. The semiconductor laser of claim 5, wherein the first and second reflectors comprise facets.

7. The semiconductor laser of claim 5, wherein the trench scatters the portion of the edge-emitted light in a direction such that the scattered portion can be measured before the semiconductor laser is separated from the fabrication wafer.

8. The semiconductor laser of claim 5, wherein the trench scatters the portion of the edge-emitted light in a direction substantially perpendicular to the plane of the fabrication wafer.

9. A method of testing a horizontal cavity edge-emitting laser while still on a fabrication wafer, comprising the steps of:
    applying a current to the edge-emitting laser so as to cause the edge-emitting laser to lase;
    non-diffractively scattering a portion of laser light from the edge-emitting laser in a different direction than the edge-emitted light using a non-diffractive light scatterer positioned proximate to an active region of the cavity, said portion being less than the entire edge-emitted light;
    measuring the non-diffractively scattered portion of the laser light from the edge-emitting laser; and
    determining a parameter of the edge-emitting laser from the measured non-diffractively scattered portion of the laser light.

10. The method of claim 9, wherein the non-diffractive light scatterer comprises a trench.

11. A method of manufacturing a horizontal cavity edge-emitting laser, comprising the steps of:
    forming a horizontal cavity edge-emitting laser on a fabrication wafer;
    causing the horizontal cavity edge-emitting laser to lase while on the fabrication wafer;
    non-diffractively scattering a portion of edge-emitted light from the horizontal cavity edge-emitting laser in a different direction than the edge-emitted light using a non-diffractive light scatterer positioned proximate to an active region of the cavity, said portion being less than the entire edge-emitted light;
    measuring the non-diffractively scattered portion of the laser light from the horizontal cavity edge-emitting laser;
    determining a parameter of the horizontal cavity edge-emitting laser from the measured non-diffractively scattered portion of the laser light; and
    separating the horizontal cavity edge-emitting laser from the fabrication wafer.

12. The method claim 11, wherein the non-diffractive light scatterer comprises a trench.

* * * * *